(12) United States Patent
Chang et al.

(10) Patent No.: US 8,629,695 B2
(45) Date of Patent: Jan. 14, 2014

(54) MULTI-STAGE SAMPLE AND HOLD CIRCUIT

(75) Inventors: Chin-Fu Chang, Taipei (TW); Guang-Huei Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/609,377

(22) Filed: Sep. 11, 2012

(65) Prior Publication Data

US 2013/0135013 A1 May 30, 2013

Related U.S. Application Data

(60) Provisional application No. 61/564,995, filed on Nov. 30, 2011.

(30) Foreign Application Priority Data

Jan. 5, 2012 (TW) .............................. 101100389 A

(51) Int. Cl.
*G11C 27/02* (2006.01)

(52) U.S. Cl.
USPC .............................................. 327/96; 327/94

(58) Field of Classification Search
USPC .................... 327/96, 94, 91, 93, 95, 336, 337
See application file for complete search history.

(56) References Cited

U.S. PATENT DOCUMENTS

| | | | | |
|---|---|---|---|---|
| 5,081,372 A | * | 1/1992 | Pelgrom | 327/95 |
| 5,311,087 A | * | 5/1994 | Suganuma | 327/94 |
| 5,708,384 A | * | 1/1998 | Shou et al. | 327/356 |
| 5,805,001 A | * | 9/1998 | Sheahan et al. | 327/142 |
| 6,441,762 B2 | * | 8/2002 | Angelici et al. | 341/150 |

* cited by examiner

*Primary Examiner* — Lincoln Donovan
*Assistant Examiner* — Jung H Kim
(74) *Attorney, Agent, or Firm* — WPAT, PC; Justin King

(57) ABSTRACT

The present invention discloses a multi-stage sample and hold (S/H) circuit that includes: a first S/H circuit for sampling a sensing signal of a sensor multiple times and accumulating them into a first sampled signal, and outputting the first sampled signal; and a second S/H circuit for receiving the plurality of first sampled signals and accumulating them into a second sampled signal. As a result, when one or more first sampled signals are saturated due to instantaneous noise, the second sampled signal is not saturated, thereby increasing the noise tolerance of the multi-stage S/H circuit.

16 Claims, 3 Drawing Sheets

MULTI-STAGE SAMPLE AND HOLD CIRCUIT

CROSS REFERENCE TO RELATED APPLICATIONS

This application claims the benefit of TW Application No. 101100389, filed on Jan. 5, 2012 and U.S. Provisional Application No. 61/564,995, filed on Nov. 30, 2011, which are herein incorporated by reference for all intents and purposes.

BACKGROUND OF THE INVENTION

1. Field of the Invention

The present invention relates to a sample and hold (S/H) circuit, and more particularly, to a multi-stage S/H circuit for reducing sampling saturation.

2. Description of the Prior Art

A sample and hold circuit for a traditional touch panel may be saturated due to large instantaneous noise. The instantaneous noise may come from a power supply, a conductive substance touching the panel, a human body approaching the panel or the like, causing a difference between a sensing value of a sensor in the touch panel and a value sampled and held by the S/H circuit. In other words, the S/H circuit must discard the value sampled and held this time, and then perform S/H operation on the sensing value of the sensor in the touch panel again. As such, not only the operation time for the S/H circuit is increased, and it may not be possible to measure the original sensing value of the sensor in the touch panel in the next S/H operation. (For example, assuming in the previous S/H operation the S/H circuit has obtained 40% of the sensing value of the sensor in the touch panel, but this value is discarded due to saturation caused by the instantaneous noise, then the S/H circuit may only obtain the remaining 60% of the sensing value of the sensor in the current S/H operation).

In view of these shortcomings, the present invention thus provides a multi-stage S/H circuit that alleviates the saturation issue caused by the instantaneous noise in traditional S/H circuits.

SUMMARY OF THE INVENTION

One objective of the present invention is to reduce the effect of instantaneous noise on overall sample and hold by performing S/H operations on a sensing signal multiple times in short durations.

Another objective of the present invention is to reduce saturation of overall S/H operations by the operations of a multi-stage S/H circuit.

The present invention discloses a multi-stage S/H circuit that may include: a first S/H circuit for sampling a sensing signal of a sensor multiple times and accumulating them into a first sampled signal, and outputting the first sampled signal at a first set time; and a second S/H circuit for receiving a plurality of the first sampled signals outputted by the first S/H circuit and accumulating them into a second sampled signal, and outputting the second sampled signal at a second set time. As a result, when one or more first sampled signals are saturated due to instantaneous noise, the second sampled signal is not saturated, thereby increasing the noise tolerance of the multi-stage S/H circuit.

In the above multi-stage S/H circuit, the first S/H circuit includes a first integration circuit and at least one first charge switch, wherein the at least one first charge switch controls the speed at which the first integration circuit multi-samples the sensing signal of the sensor.

In the above multi-stage S/H circuit, the at least one first charge switch controls the number of samples taken by the first integration circuit on the sensing signal of the sensor within the first set time.

In the above multi-stage S/H circuit, the second S/H circuit includes a second integration circuit and at least one second charge switch, wherein the at least one second charge switch controls the duration of the first set time.

In the above multi-stage S/H circuit, the at least one second charge switch controls the number of first sample signals received by the second integration circuit within the second set time.

The above multi-stage S/H circuit may further include at least one output switch for controlling the duration of the second set time.

In the above multi-stage S/H circuit, the sensor includes a conductive wire of a touch panel.

The present invention also discloses a multi-stage sample and hold (S/H) circuit that may include: a first operational amplifier including a first input, a second input and a first output, wherein the first input is electrically coupled to a sample input and the second input is electrically coupled to a reference voltage; a first capacitor including a first end and a second end, wherein the first end is electrically coupled to the first input via a first switch, and the second end is electrically coupled to the first output via a second switch, and the second end is further electrically coupled to the reference voltage via a third switch, and the first end is further electrically coupled to one end of a fourth switch; a second operational amplifier including a third input, a fourth input and a second output, wherein the third input is electrically coupled to the other end of the fourth switch and the fourth input is electrically coupled to the reference voltage; and a second capacitor including a third end and a fourth end, wherein the third end is electrically coupled to the third input via a fifth switch, the fourth end is electrically coupled to the second output via a sixth switch, and the third end is further electrically coupled to the reference voltage via a seventh switch, and the fourth end is further electrically coupled to a sample output via an eighth switch.

The above multi-stage S/H circuit may further include a ninth switch connected in parallel with the first capacitor.

The above multi-stage S/H circuit may further include a tenth switch connected in series between the sample input and the second input of the first operational amplifier.

The present invention further discloses a multi-stage sample and hold (S/H) circuit for reducing sampling saturation caused by instantaneous noise. The multi-stage S/H circuit may include: n S/H circuits cascaded to form an n-stage S/H circuit, wherein each S/H circuit receives a plurality of sampled signals from a previous S/H circuit and accumulates them into an accumulated signal, and outputs this accumulated signal to a next S/H circuit as one of a plurality of sampled signals received, wherein n≥2 and is a natural number, wherein a first-stage S/H circuit of the n-stage S/H circuit samples a sensing signal of a sensor multiple times and accumulates them to obtain the accumulated signal for the first-stage S/H circuit.

In the above multi-stage S/H circuit, each of the n S/H circuits outputs the accumulated signal of the respective n S/H circuit after a relative set time.

In the above multi-stage S/H circuit, each of the n S/H circuits includes an integration circuit and at least one switch, wherein the at least one switch controls the duration of the relative set time of the previous S/H circuit.

In the above multi-stage S/H circuit, the at least one switch of the first-stage S/H circuit controls the number of samples taken by the integration circuit of the first-stage S/H circuit on the sensing signal of the sensor within the relative set time.

In the above multi-stage S/H circuit, the at least one switch of each of the n S/H circuits controls the number of the sampled signals received by the integration circuit of the first-stage S/H circuit within the relative set time.

In the above multi-stage S/H circuit, the sensor includes a conductive wire of a touch panel.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
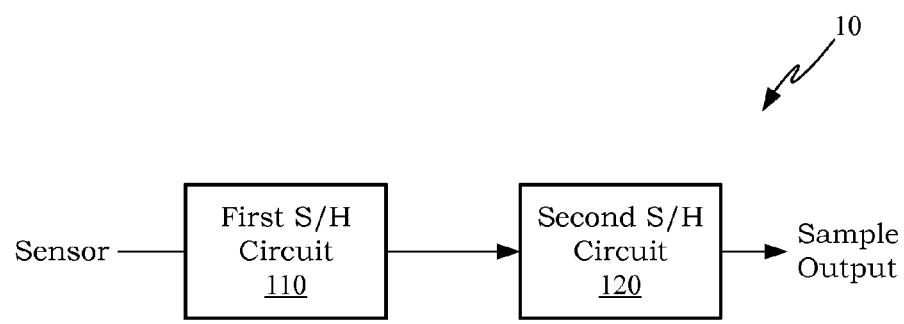
FIG. 1A is a schematic diagram illustrating a preferred embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1A, a block diagram illustrating a preferred embodiment 10 of the present invention is shown. A first sample and hold (S/H) circuit 110 samples a sensing signal of a sensor multiple times and accumulates them into a first sampled signal, and outputs this first sampled signal at a first set time. A second S/H circuit 120 receives a plurality of the first sampled signals outputted by the first S/H circuit 110 and sums them into a second sampled signal, and outputs this second sampled signal at a second set time. In this embodiment, the first S/H circuit 110 first samples the sensing signal of the sensor in multiple short durations, and accumulates them and stores the result, and then outputs it to the second S/H circuit 120. The second S/H circuit 120 receives a plurality of outputs from the first S/H circuit 110 and sums them and stores the result, and finally outputs the total sensing signal of the sampled sensor. The second set time can be equal to or larger than the first set time. In a preferred example of the present invention, the second set time is larger than the first set time or equal to several multiples of the first set time.

In the above operations of the first S/H circuit 110 and the second S/H circuit 120, even if the first S/H circuit 110 is saturated due to the instantaneous noise being too large, this only affects a small portion (one or a few samples) of the multi-sampled result of the first S/H circuit 110, and the sampled result of the second S/H circuit 120 will not be significantly influenced, thus eliminating the saturation issue of traditional S/H circuits caused by large instantaneous noise. For example, assuming the first S/H circuit 110 samples and accumulates the sensing signal in three short durations (e.g. 3 times/0.5 pulse) before outputting the result to the second S/H circuit 120; and the second S/H circuit 120 receives and sums 20 outputs of the first S/H circuit 110 before outputting the sampled total sensing signal. Thus, even if the first S/H circuit 110 is saturated one or a few times due to the instantaneous noise, it is not likely to saturate the second S/H circuit 120 during the sampling process, thereby increasing the noise tolerance of the S/H circuit. Furthermore, for the total sampled sensing signal, even if one or some saturated result(s) of the first S/H circuit 110 are discarded or summed, the effect on the sampled total sensing signal is relatively smaller than that in the prior art. For example, assuming two sampled results in the first S/H circuit 110 have become saturated due to the instantaneous noise being too large, they only account for 1/10 of the total 20 samples taken by the second S/H circuit 120.

In an example of the present invention, a saturation detection circuit (not shown) can be further included. This can be achieved by a comparator, for example. When saturation of the first S/H circuit 110 is detected, output of the first sampled signals is stopped or input of the first sampled signals is prevented from inputting to the second S/H circuit 120. Meanwhile, the second set time is adjusted (prolonged) based on, for example, the output of the comparator. Each time the increased duration is equal to or larger than the first set time. Accordingly, the second set time is adjusted flexibly to eliminate the saturated first sampled signals and make the second sample signals more accurately.

Figure 2:
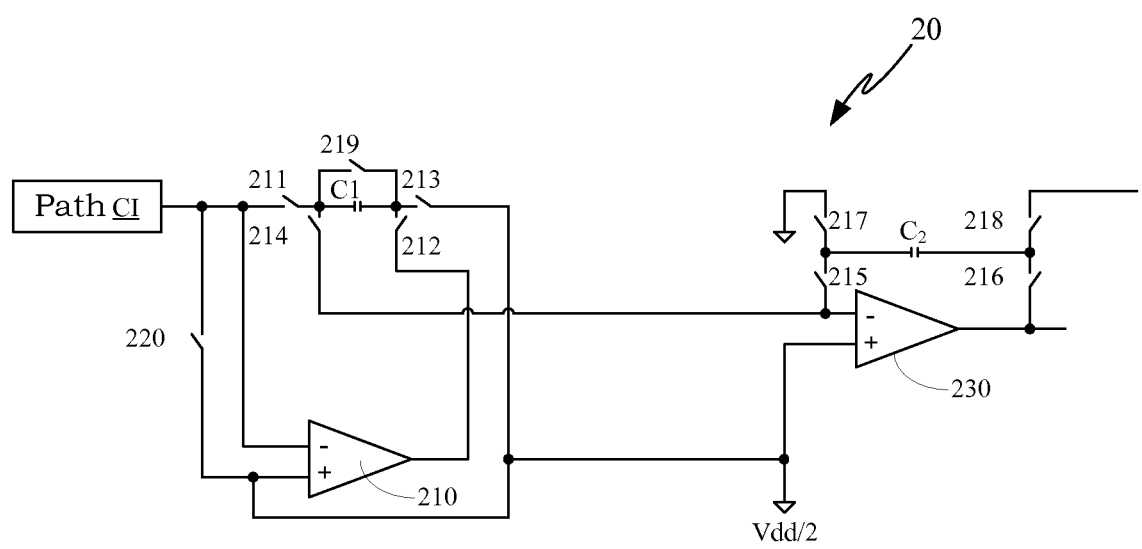
FIG. 2 is a circuit diagram illustrating a preferred embodiment of the present invention.
Figure 3:
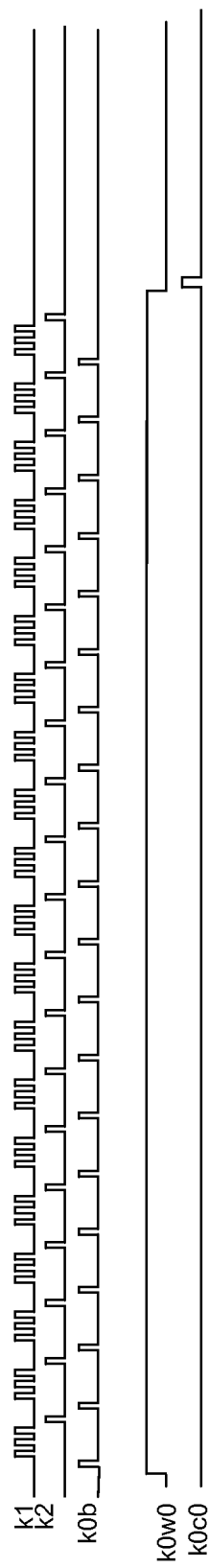
FIG. 3 is a preferred timing diagram for the preferred embodiment shown in FIG. 2.

Referring to FIGS. 2 and 3, a circuit diagram and a timing diagram for a preferred circuit 20 of the embodiment 10 described with respect to FIG. 1A of the present invention are shown, respectively. As shown, a first S/H circuit includes an operational amplifier (e.g. a first operational amplifier 210), a capacitor (e.g. a first capacitor C1) and a plurality of switches (e.g. 211, 212, 213 and 214), wherein the capacitor and the operational amplifier form a first integration circuit. The plurality of switches are connected to the charge/discharge paths of the capacitor, thereby controlling charge/discharge times of the capacitor. A second S/H circuit also includes an operational amplifier (e.g. a second operational amplifier 230), a capacitor (e.g. a second capacitor C2) and a plurality of switches (e.g. 215, 216, 217 and 218), wherein the capacitor and the operational amplifier form a second integration circuit, and the plurality of switches are connected to the charge/discharge paths of the capacitor, thereby controlling charge/discharge times of the capacitor.

Referring still to FIGS. 2 and 3, when a timing signal k1 for controlling at least a first charge switch (e.g. the first switch 211 and the second switch 212) is a positive pulse, the first switch 211 and the second switch 212 are turned on, forming a charge path with the first capacitor C1 and the first operational amplifier 210. At this time, a sensing signal on the path charges the first capacitor C1, i.e. the first S/H circuit samples the sensing signal of a corresponding sensor on the path. When a timing signal k2 for controlling at least a first discharge switch (e.g. the third switch 213 and the fourth switch 214) is a positive pulse, the third switch 213 and the fourth switch 214 are turned on, forming a discharge path with the first capacitor C1 and a reference potential (e.g. half of the power supply voltage (Vdd/2)). At this time, the first capacitor C1 discharges to the second S/H circuit, i.e., the first S/H circuit outputs the sampled and held result. In this embodiment, three k1 positive pulses are followed by one k2 positive pulse; in other words, the first S/H circuit in this embodiment performs 3 samplings with short durations, accumulates them and then outputs the result to the second S/H circuit. The number of short-duration samplings for accumulation performed by the first S/H circuits can be adjusted according to actual needs, and the present invention is not limited to this.

From another perspective, the at least one first charge switch controls the speed at which the first integration circuit multi-samples the sensing signal. In other words, When the at least one first charge switch is turned on more times before the first S/H circuit outputs the S/H result, the number of samples taken on the sensing signal by the first integration circuit in the first set time also increases. In another embodiment of the present invention, the at least one first charge switch may include only the first switch 211 or the second switch 212.

Referring again to FIGS. 2 and 3, when a timing signal k0w0 for controlling at least a second charge switch (e.g. the fifth switch 215 and the sixth switch 216) is a positive pulse, the fifth switch 215 and the sixth switch 216 are turned on, and the S/H result from the first capacitor C1 charges the second capacitor C2. That is, the second S/H circuit receives the first S/H signal output by the first S/H circuit. When a timing signal k0c0 for controlling at least a second discharge switch (e.g. the seventh switch 217 and the eighth switch 218) is a positive pulse, the seventh switch 217 and the eighth switch 218 are turned on, and the second capacitor C2 discharges to output via the eighth switch 218 using Vdd/2 (not limited to this value) as a reference potential via the seventh switch 217. That is, the second S/H circuit outputs its S/H result. In this embodiment, after 20 k2 pulses, the timing signal k0w0 for controlling at least a second charge switch (e.g. the fifth switch 215 and the sixth switch 216) changes from positive to negative voltage potential and the timing signal k0c0 for controlling at least a second discharge switch (e.g. the seventh switch 217 and the eighth switch 218) changes from negative to positive voltage potential. In other words, the second S/H circuit in this embodiment receives 20 first S/H signals outputted by the first S/H circuit before summing them and outputting the result. The number of first S/H signals received by the second S/H circuit can be adjusted according to needs, and the present invention is not limited to this. From another perspective, the above at least one first discharge switch and the at least one second charge switch controls the duration of the first set time, and the number of first S/H signals received by the second integration circuit before the second S/H circuit outputs the S/H result. That is, when the turned-on frequency of the at least one first discharge switch is higher (or when the turned-on frequency of the at least one second charge switch is higher), then the first set time is shorter. When the turned-on frequency of the at least one second charge switch is higher, the number of first S/H signals received by the second integration circuit within the second set time also increases. In another embodiment of the present invention, the above at least one first discharge switch can be integrated into the at least one second charge switch, thereby controlling the discharge operation of the first integration circuit and the charge operation of the second integration circuit by a single second charge switch.

Referring again to FIGS. 2 and 3, when a timing signal k0b for controlling a clear switch (e.g. the ninth switch 219) is a positive pulse, the ninth switch 219 is turned on and the first capacitor C1 is cleared. In this embodiment, a k0b positive pulse occurs before every three k1 positive pulses and/or after every one k2 positive pulse. This means that the first S/H circuit performs clearing of the first capacitor C1 before multi-sampling and accumulating and after output of a first S/H signal to ensure no remaining charge in the capacitor that may affect the next sampling result. A sample control switch 220 is controlled by an inverse timing signal of k1. When the sample control switch 220 is turned on, the first S/H circuit cannot perform sampling and accumulating operations.

In terms of circuit architecture, referring again to FIG. 2, a preferred embodiment of the present invention includes: a first operational amplifier 210 having a first input, a second input and a first output, wherein the first input is electrically coupled to a sample input (path CI) and the second input is electrically coupled to a reference voltage (e.g. Vdd/2); a first capacitor with a first end and a second end, wherein the first end is electrically coupled to the first input via a first switch 211, and the second end is electrically coupled to the first output via a second switch 212, and the second end is further electrically coupled to the reference voltage via a third switch 213, and the first end is further electrically coupled to one end of a fourth switch 214; a second operational amplifier 230 with a third input, a fourth input and a second output, wherein the third input is electrically coupled to the other end of the fourth switch 214 and the fourth input is electrically coupled to the reference voltage; and a second capacitor C2 with a third end and a fourth end, wherein the third end is electrically coupled to the third input via a fifth switch 215, the fourth end is electrically coupled to the second output via a sixth switch 216, and the third end is further electrically coupled to the reference voltage via a seventh switch 217, and the fourth end is further electrically coupled to a sample output via an eighth switch 218. In addition, this embodiment further includes a ninth switch 219 connected in parallel with the first capacitor C1 and a tenth switch 220 connected in series between the sample input and the second input of the first operational amplifier 210.

Figure 1B:
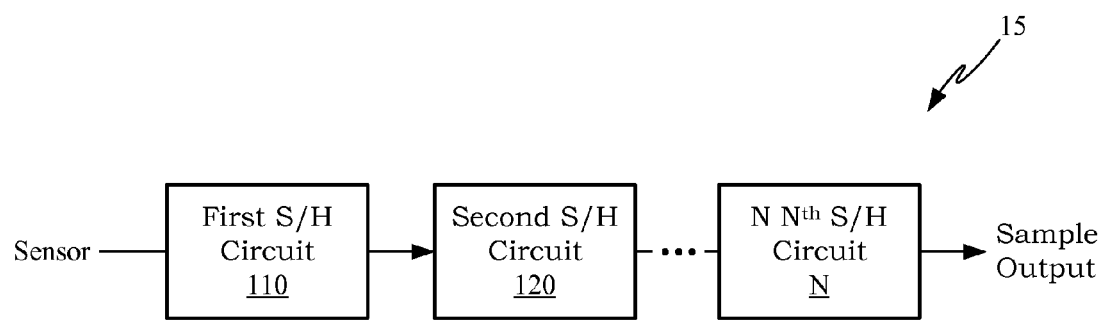
FIG. 1B is a schematic diagram illustrating another preferred embodiment of the present invention.

Referring to FIG. 1B, a block diagram illustrating a preferred embodiment 15 of the present invention is shown. The difference between FIGS. 1B and 1A is in that the embodiment of FIG. 1B expands the embodiment shown in FIG. 1A in to an n-stage S/H circuit (e.g. the first S/H circuit 110, the second S/H circuit 120 . . . and an $n^{th}$ S/H circuit N), wherein n≥2 and is a natural number. Thus, from the perspective of the n-stage circuit, this embodiment includes: n S/H circuit cascaded to form an n-stage S/H circuit, wherein each S/H circuit receives a plurality of sampled signals from the previous S/H circuit and accumulates them into an accumulated signal, and outputs this accumulated signal to the next S/H circuit as one of a plurality of sampled signals received, wherein the first-stage S/H circuit of the n-stage S/H circuit multi-samples a sensing signal of a sensor and accumulates them to obtain an accumulated signal for the first-stage S/H circuit. In this embodiment, a previous S/H circuit means a S/H circuit (e.g. the first S/H circuit 110) other than the current S/H circuit (e.g. the second S/H circuit 120) and the output of this other circuit is received by the current S/H circuit; a next S/H circuit means a S/H circuit (e.g. the second S/H circuit 120) other than the current S/H circuit and this other circuit receives the output of the current S/H circuit.

In an example of the present invention, a saturation detection circuit can similarly be included. The saturation detection circuit can be provided in one or more stages of the n-stage S/H circuit. When the saturation detection circuit is provided in the $i^{th}$ stage, and if saturation is detected, for example, the output of the $i^{th}$-stage S/H circuit is detected to be saturated, then the output of the $i^{th}$-stage S/H circuit is prevented from entering to the next S/H circuit, and the signal integration time (i.e. signal sampling time) of the next or every subsequent stage is adjusted.

In the above n S/H circuit, each S/H circuit outputs the accumulated signal after a relative set time. For example, the first S/H circuit 110 outputs the accumulated signal after a first set time, the second S/H circuit 120 outputs the accumulated signal after a second set time, and so on, and the $n^{th}$ S/H circuit N outputs the accumulated signal after a $n^{th}$ set time. Each relative set time can be adjusted according to actual needs, and the present invention is not limited to this. In this embodiment, each S/H circuit includes an integration circuit and at least one switch, wherein the at least one switch controls the duration of the relative set time of the previous S/H circuit. For the first-stage S/H circuit, the at least one switch is used to control the number of samples taken on the sensing signal by the integration circuit in the relative set time. From another perspective, the at least one switch of each S/H circuit is used to control the number of sampled signals received by the integration circuit within the relative set time.

Finally, the sensor as mentioned in all embodiments of the present invention may refer to one of a plurality of conductive wires in a touch panel.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A multi-stage sample and hold (S/H) circuit for reducing sampling saturation caused by instantaneous noise, comprising:
    a first S/H circuit for sampling a sensing signal of a sensor multiple times and accumulating the results of the multiple samplings into a first sampled signal, and outputting the first sampled signal at a first set time; and
    a second S/H circuit for receiving a plurality of the first sampled signals outputted by the first S/H circuit at a plurality of the first set times and accumulating them into a second sampled signal, and outputting the second sampled signal at a second set time.

2. The multi-stage S/H circuit of claim 1, wherein the first S/H circuit includes a first integration circuit and at least one first charge switch, wherein the at least one first charge switch controls the speed at which the first integration circuit multi-samples the sensing signal of the sensor.

3. The multi-stage S/H circuit of claim 2, wherein the at least one first charge switch controls the number of samples taken by the first integration circuit on the sensing signal of the sensor within the first set time.

4. The multi-stage S/H circuit of claim 1, wherein the second S/H circuit includes a second integration circuit and at least one second charge switch, wherein the at least one second charge switch controls the duration of the first set time.

5. The multi-stage S/H circuit of claim 4, wherein the at least one second charge switch controls the number of first sample signals received by the second integration circuit within the second set time.

6. The multi-stage S/H circuit of claim 1, further comprising at least one output switch for controlling the duration of the second set time.

7. The multi-stage S/H circuit of claim 1, wherein the sensor includes a conductive wire of a touch panel.

8. A multi-stage sample and hold (S/H) circuit, comprising:
    a first operational amplifier including a first input, a second input and a first output, wherein the first input is electrically coupled to a sample input and the second input is electrically coupled to a reference voltage;
    a first capacitor including a first end and a second end, wherein the first end is electrically coupled to the first input via a first switch, and the second end is electrically coupled to the first output via a second switch, and the second end is further electrically coupled to the reference voltage via a third switch, and the first end is further electrically coupled to one end of a fourth switch;
    a second operational amplifier including a third input, a fourth input and a second output, wherein the third input is electrically coupled to the other end of the fourth switch and the fourth input is electrically coupled to the reference voltage; and
    a second capacitor including a third end and a fourth end, wherein the third end is electrically coupled to the third input via a fifth switch, the fourth end is electrically coupled to the second output via a sixth switch, and the third end is further electrically coupled to the reference voltage via a seventh switch, and the fourth end is further electrically coupled to a sample output via an eighth switch.

9. The multi-stage S/H circuit of claim 8, further comprising a ninth switch connected in parallel with the first capacitor.

10. The multi-stage S/H circuit of claim 8, further comprising a tenth switch connected in series between the sample input and the second input.

11. A multi-stage sample and hold (S/H) circuit for reducing sampling saturation caused by instantaneous noise, comprising:
    n S/H circuits cascaded to form an n-stage S/H circuit, wherein each S/H circuit receives a plurality of sampled signals from a previous S/H circuit sampled at different times and accumulates them into an accumulated signal, and outputs this accumulated signal to a next S/H circuit as one of a plurality of sampled signals received, wherein n≥2 and is a natural number,
    wherein a first-stage S/H circuit of the n-stage S/H circuit samples a sensing signal of a sensor multiple times and accumulates them to obtain the accumulated signal for the first-stage S/H circuit.

12. The multi-stage S/H circuit of claim 11, wherein each of the n S/H circuits outputs the accumulated signal of the respective n S/H circuit after a relative set time.

13. The multi-stage S/H circuit of claim 12, wherein each of the n S/H circuits includes an integration circuit and at least one switch, wherein the at least one switch controls the duration of the relative set time of the previous S/H circuit.

14. The multi-stage S/H circuit of claim 13, wherein the at least one switch of the first-stage S/H circuit controls the number of samples taken by the integration circuit of the first-stage S/H circuit on the sensing signal of the sensor within the relative set time.

15. The multi-stage S/H circuit of claim 13, wherein the at least one switch of each of the n S/H circuits controls the number of the sampled signals received by the integration circuit of the first-stage S/H circuit within the relative set time.

16. The multi-stage S/H circuit of claim 11, wherein the sensor includes a conductive wire of a touch panel.

* * * * *